(12) United States Patent
Prodanov

(10) Patent No.: US 6,577,170 B1
(45) Date of Patent: Jun. 10, 2003

(54) CMOS TRANSCONDUCTOR WITH INCREASED DYNAMIC RANGE

(76) Inventor: Vladimir I. Prodanov, 124 Hawthorne Dr., New Providence, NJ (US) 07974

( * ) Notice: Subject to any disclaimer, the term of this patent is extended or adjusted under 35 U.S.C. 154(b) by 0 days.

(21) Appl. No.: 09/994,541

(22) Filed: Nov. 27, 2001

(51) Int. Cl.⁷ .................................................. H03K 5/22

(52) U.S. Cl. .......................... 327/103; 327/65; 327/77; 327/563; 330/253

(58) Field of Search .......................... 330/253; 327/103, 327/65, 66, 77, 560–563

(56) References Cited

U.S. PATENT DOCUMENTS

| | | | | |
|---|---|---|---|---|
| 5,561,396 A | * | 10/1996 | Hogervorst et al. | 330/253 |
| 5,602,509 A | * | 2/1997 | Kimura | 330/253 |
| 6,380,805 B1 | * | 4/2002 | Bily et al. | 330/253 |
| 6,420,912 B1 | * | 7/2002 | Hsu et al. | 327/103 |

OTHER PUBLICATIONS

Vladimir Prodanov, George Palaskas, Jack Glas, Vito Boccuzzi, "A CMOS AGC–less IF Strip for Bluetooth," Sep. 19, 2001 European Solid State Circuit Conference, pp. 1–4.

* cited by examiner

*Primary Examiner*—Toan Tran
(74) *Attorney, Agent, or Firm*—Gardner Groff, P.C.

(57) ABSTRACT

A CMOS transconductor that operates with increased dynamic range while maintaining one or more other basic operating characteristics at substantially the same value in comparison to a prior art transconductor circuit is provided. One embodiment, among others, comprises an input stage circuit comprising several pluralities of transistors with each plurality configured such that certain terminals of the transistors are electrically connected, and the several pluralities are electrically interconnected through one or more terminals of each plurality. Another embodiment comprises modifying an input stage of an existing transconductor circuit to provide a transconductor circuit that operates with increased dynamic range while maintaining one or more other basic operating characteristics at substantially the same value in comparison to the existing transconductor circuit.

10 Claims, 7 Drawing Sheets

US 6,577,170 B1

CMOS TRANSCONDUCTOR WITH INCREASED DYNAMIC RANGE

TECHNICAL FIELD OF THE INVENTION

The present invention is generally related to the field of communications and, more particularly, to a CMOS transconductor with increased dynamic range.

BACKGROUND OF THE INVENTION

Complementary metal-oxide semiconductor ("CMOS") transconductors have a wide range of applications in the field of communications, among other fields. CMOS transconductors, also known as voltage-to-current ("V-I") converters, are employed, for example, in various circuits of communications systems, such as intermediate frequency ("IF") transmitters and receivers. Another example of an application of CMOS transconductors is in IF filter circuits, also utilized in communications systems, such as frequency selective networks made up of CMOS transconductors and capacitors.

A typical configuration of a CMOS transconductor circuit 100, as is known in the art, is shown in FIG. 1. As shown, the CMOS transconductor circuit 100 includes several components. The transconductor circuit 100 includes several CMOS field-effect transistors ("MOSFETs"). The MOSFETs 102–106 are electrically interconnected in a configuration that provides voltage to current conversion between the inputs 108, 109 and outputs 110, 111 of the transconductor circuit 100.

The transconductor circuit 100 includes two voltage input terminals 108, 109 that connect to the gate terminals of the MOSFETs 104 and 105 respectively, as shown. These MOSFETs 104, 105 accordingly make up the input stage 101 of the transconductor circuit 100. Also as shown, the transconductor circuit 100 includes two current output terminals 110, 111 that connect at the nodes between the drain terminals of MOSFETs 102 and 104 and between the drain terminals of MOSFETs 103 and 105, respectively, of the transconductor circuit 100.

Finally, the transconductor circuit 100 includes a voltage supply rail 112 which provides a voltage to the transconductor circuit 100 via the source terminals of MOSFETs 102, 103. Also, the transconductor circuit 100 includes a ground 118 electrically connected to the source terminal of MOSFET 106 which may consist of, for example, a terminal connected to a common ground point in the transconductor circuit 100. Further, the transconductor circuit 100 includes MOSFET bias inputs 114, 115 that provide a bias signal to MOSFETs 102, 103, 106 via their respective gate terminals.

A CMOS transconductor or V-I converter, such as the transconductor circuit 100 described above, has several basic operating characteristics, as is known in the art, which are described in the following. The input linear range ("$V_{in,max}$") of a CMOS transconductor is the maximum input voltage at which the transconductor can still perform substantially linear voltage-to-current conversion. The transconductance value ("gm") of a CMOS transconductor is a value that is approximately equivalent to the ratio of the output current ("$I_{out}$") to the input voltage ("$V_{in}$") of the transconductor. The total integrated output noise current ("$I_{n,rms}$") is the noise current produced by a CMOS transconductor integrated over a given bandwidth. This characteristic determines the minimum resolvable output signal of the transconductor and is also referred to as the minimum detectable output current. The power consumption (or power dissipation) of a CMOS transconductor is proportional to the bias current ("$I_{bias}$") for a class-A transconductor.

A CMOS transconductor also has the basic operating characteristic values of input impedance, output impedance, 3 dB bandwidth, and minimum-required voltage headroom ("voltage headroom") (i.e., the capability of the transconductor to operate from low supply voltages), which are understood in the art. Further, the maximum output current ("$I_{out,max}$") of a CMOS transconductor can be defined as the product of the transconductance value times the input linear range. Finally, a CMOS transconductor has the basic operating characteristic value of the dynamic range ("$DR_{V-I}$"), which is defined as the ratio between the maximum signal and the minimum signal that the transconductor can reliably process. The dynamic range can be determined by the ratio of the maximum output current to the minimum detectable output current, that is:

$$DR_{V-I} = 20 \times \log_{10} \times \left( \frac{gm \times V_{in,max}}{\sqrt{2} \times i_{n,rms}} \right), dB \qquad \text{Eq. 1}$$

An important goal in the design of circuits utilizing CMOS transconductors is to obtain a high dynamic range. Typically this can be achieved by paralleling one or more CMOS tranconductors that are utilized in a circuit. However, this "brute force" approach to increasing the dynamic range of the circuit has the significant consequence of increasing the power consumption and chip area of the circuit. For example, for every 3 dB increase in dynamic range achieved by adding a transconductor in parallel to a circuit, there is a 6 dB increase in power consumption of the circuit and a corresponding increase in chip area to facilitate the added transconductor.

Thus, a need exists for a CMOS transconductor with increased dynamic range that does not suffer from the increased power consumption and chip area requirements of prior art transconductor circuits.

SUMMARY OF THE INVENTION

The present invention provides a CMOS transconductor that operates with increased dynamic range while maintaining one or more other basic operating characteristics at substantially the same value in comparison to a prior art transconductor circuit.

Briefly described, in architecture, one embodiment of the present invention, among others, can be implemented as an input stage circuit comprising several pluralities of transistors with each plurality of transistors configured such that certain terminals of the transistors are electrically connected, and the several pluralities of transistors are also electrically interconnected through one or more terminals of each plurality of transistors.

The present invention can also be viewed as providing methods for providing a CMOS transconductor that operates with increased dynamic range while maintaining substantially the same other basic operating characteristics in comparison to a prior art transconductor circuit. In this regard, one embodiment of a method of the present invention, among others, can be broadly summarized by the step of modifying an input stage of an existing transconductor circuit to provide a transconductor circuit that operates with increased dynamic range while maintaining one or more other basic operating characteristics at substantially the same value in comparison to the existing transconductor circuit.

Other features and advantages of the present invention will be or become apparent to one with skill in the art upon examination of the following drawings and detailed description. It is intended that all such additional features and advantages be included within this description, be within the scope of the present invention, and be protected by the accompanying claims.

DETAILED DESCRIPTION OF THE INVENTION

Figure 1:
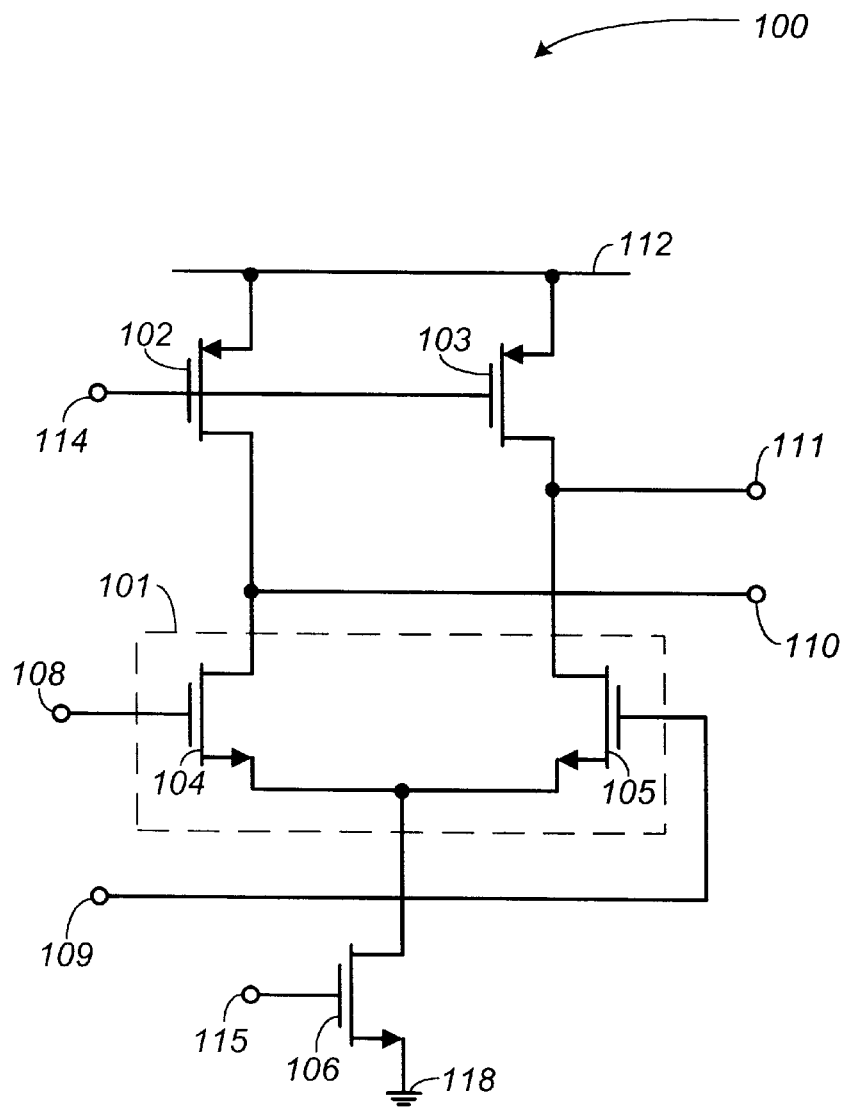
FIG. 1 shows a typical configuration of a CMOS transconductor circuit, as is known in the art.

Having summarized the invention above, reference is now made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims. Indeed, the present invention is believed to be applicable to a variety of systems, devices, and technologies.

Figure 2:
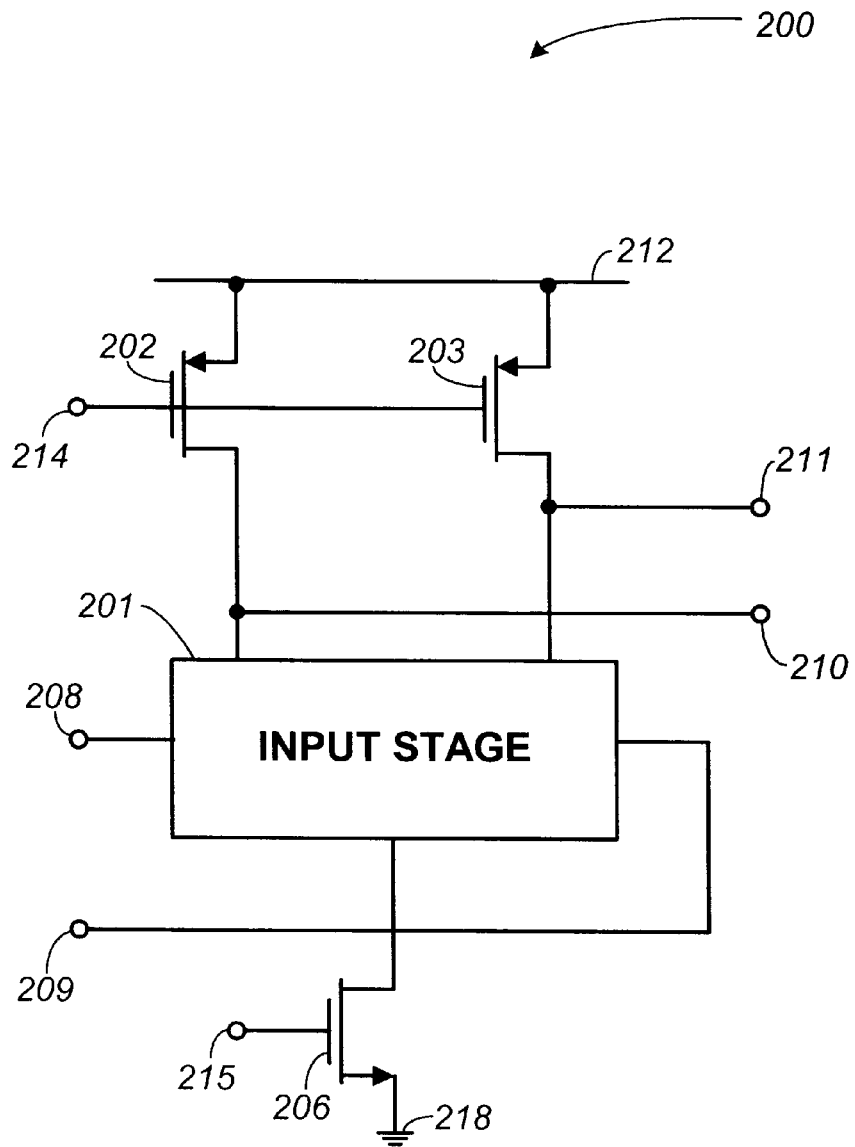
FIG. 2 shows a CMOS transconductor circuit in accordance with an embodiment of the present invention.

Turning now to the drawings, FIG. 2 shows a CMOS transconductor circuit 200 in accordance with an embodiment of the present invention. The CMOS transconductor circuit 200 includes several MOSFETs 202, 203, 206 electrically interconnected as shown. Significantly, the transconductor circuit 200 also includes an input stage 201, in accordance with an embodiment of the present invention, which will be discussed in further detail below.

The transconductor circuit 200 includes two voltage input terminals 208, 209 that connect to the input stage 201 as shown. Also as shown, the transconductor circuit 200 includes two current output terminals 210, 211 that connect at the nodes between the drain terminal of MOSFET 202 and the input stage 201 and between the drain terminal of MOSFET 203 and the input stage 201, respectively, of the transconductor circuit 200.

The transconductor circuit 200 further includes a voltage supply rail 212 which provides a voltage to the transconductor circuit 200 via the source terminals of MOSFETs 202, 203. Also, the transconductor circuit 200 includes a ground 218 electrically connected to the source terminal of MOSFET 206 which may comprise, for example, a terminal connected to a common ground point in the transconductor circuit 200. Still further, the transconductor circuit 200 includes MOSFET bias inputs 214, 215 that provide a bias signal to MOSFETs 202, 203, 206 via their respective gate terminals.

The input stage 201 of the transconductor circuit 200, as shown in FIG. 2, is electrically interconnected to the MOSFETs 202, 203, 206. The input stage 201 comprises circuitry that allows the transconductor circuit 200 to provide increased dynamic range performance without causing the typical increase in power consumption and chip area that results with the prior art approach of increasing dynamic range by paralleling transconductor circuits, as discussed above. The input stage 201 can be implemented in a plurality of embodiments, several of which will be presented below. Also, several embodiments of a method to provide the plurality of embodiments of the input stage 201 will be presented subsequently below.

Figure 3:
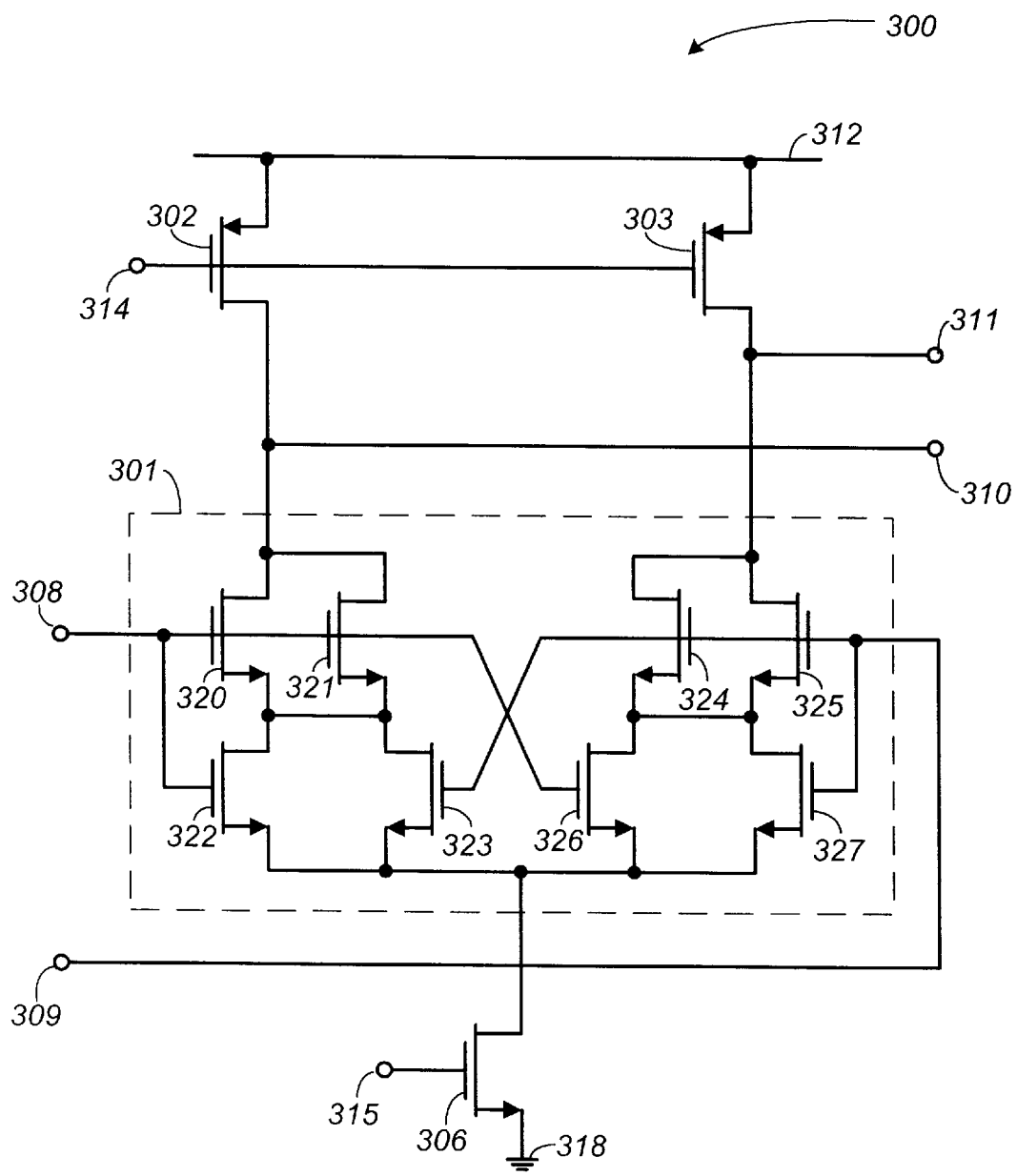
FIG. 3 shows a CMOS transconductor circuit with an input stage in accordance with an embodiment of the present invention as introduced in FIG. 2.

FIG. 3 shows a CMOS transconductor circuit 300 with an input stage 301 in accordance with an embodiment of the present invention as introduced in FIG. 2. The transconductor circuit 300 includes several of the components introduced in the transconductor circuit 200 of FIG. 2. The transconductor circuit 300 comprises several electrically interconnected MOSFETs 302, 303, 306. The transconductor circuit 300 also comprises two voltage input terminals 308, 309 that connect to an input stage 301 as shown. As also shown in FIG. 3, the transconductor circuit 300 comprises two current output terminals 310, 311 that connect at the nodes between the drain terminal of MOSFET 302 and the input stage 301 and between the drain terminal of MOSFET 303 and the input stage 301, respectively, of the transconductor circuit 300.

The transconductor circuit 300 further comprises a voltage supply rail 312 which provides a voltage to the transconductor circuit 300 via the source terminals of MOSFETs 302, 303. Also, the transconductor circuit 300 comprises a ground 318 electrically connected to the source terminal of MOSFET 306 which may comprise, for example, a terminal connected to a common ground point in the transconductor circuit 300. Still further, the transconductor circuit 300 includes MOSFET bias inputs 314, 315 that provide a bias signal to MOSFETs 302, 303, 306 via their respective gate terminals.

Significant to the performance of the transconductor circuit 300 is the input stage 301 which allows the transconductor circuit 300 to provide increased dynamic range performance without causing the typical increase in power consumption and chip area that occurs in prior art circuits that provide similar dynamic range performance. As shown in FIG. 3, the input stage 301 comprises a plurality of electrically interconnected MOSFETs 320–327. The input stage 301 is also electrically interconnected to other elements of the transconductor circuit 300 that were described above.

The MOSFETs 320–327 are electrically interconnected in various configurations that may be described as parallel, pseudo-parallel, series, or pseudo-series configurations. The electrical interconnection of the MOSFETs 320, 321 is an example of a parallel configuration since the drain terminals, gate terminals, and source terminals respectively of the MOSFETs 320, 321 are electrically connected. The electrical interconnection of the MOSFETs 322, 323 is an example of a pseudo-parallel configuration since the drain terminals and source terminals respectively of the MOSFETs 320, 321 are electrically connected but the gate terminals of the MOSFETs 320, 321 are not connected; it should be noted, however, that if the voltage input terminals 308, 309 were electrically connected, then the MOSFETs 322, 323 would be in a parallel configuration. The electrical interconnection of the MOSFETs 320, 322 is an example of a series configuration since the gate terminals of the MOSFETs 320, 322 are electrically connected and the source terminal of the MOSFET 320 is electrically connected to the drain terminal of the MOSFET 322. Finally, the electrical interconnection of the MOSFETs 321, 323 is an example of a pseudo-series configuration since the source terminal of the MOSFET 321 is electrically connected to the drain terminal of the MOSFET 323 but the gate terminals of the MOSFETs 321, 323 are not connected; it should be noted, however, that if the voltage input terminals 308, 309 were electrically connected, then the MOSFETs 321, 323 would be in a series configuration.

Several basic operating characteristics of the transconductor circuit 300 in comparison to the prior art transconductor circuit 100 (FIG. 1) are substantially the same with the important exception, however, that the dynamic range of the transconductor circuit 300 is significantly increased over the dynamic range of the prior art transconductor circuit 100. This increase in dynamic range of the transconductor circuit 300 is the result of the input stage 301 providing an increased input linear range due to, in part, an increase in the number of MOSFETs that comprise the input stage circuit 301. Although the input stage 301 provides a slightly decreased transconductance value for the transconductor circuit 300, this decrease is relatively smaller than the increase of the input linear range, and as a result, the product of the input linear range ("$V_{in,max}$") times the transconductance value ("gm") of the circuit 300 is increased. A review of Eq. 1, which was introduced above and is repeated hereafter for reference, shows that an increase in the product of the input linear range times the transconductance value directly influences the increase in the dynamic range ("DR") of a transconductor circuit.

$$DR_{V-I} = 20 \times \log_{10} \times \left( \frac{gm \times V_{in,max}}{\sqrt{2} \times i_{n,rms}} \right), dB \qquad \text{Eq. 1}$$

Significantly, however, the power consumption of the transconductor circuit 300 is the same as that of the prior art transconductor circuit 100 since the total area (i.e., W/L) of the MOSFETs 320–327 of the input stage 301 is configured to be the same as the total area of the MOSFETs 104, 105 of the input stage 101 of the prior art circuit 100. Further, the output noise current and voltage headroom of the transconductor circuit 300 may be substantially the same as that of the prior art transconductor circuit 100, dependent, for example, on the production quality of the MOSFETs 320–327, such that the values of these basic operating characteristics do not differ by more than ±5%. Additionally, the input impedance, output impedance, and 3 dB bandwidth of the transconductor circuit 300 may differ negligibly from that of the prior art transconductor circuit 100 since, as described above, the total MOSFET area of the input stage 301 is the same as that of the prior art input stage 101.

Figure 4:
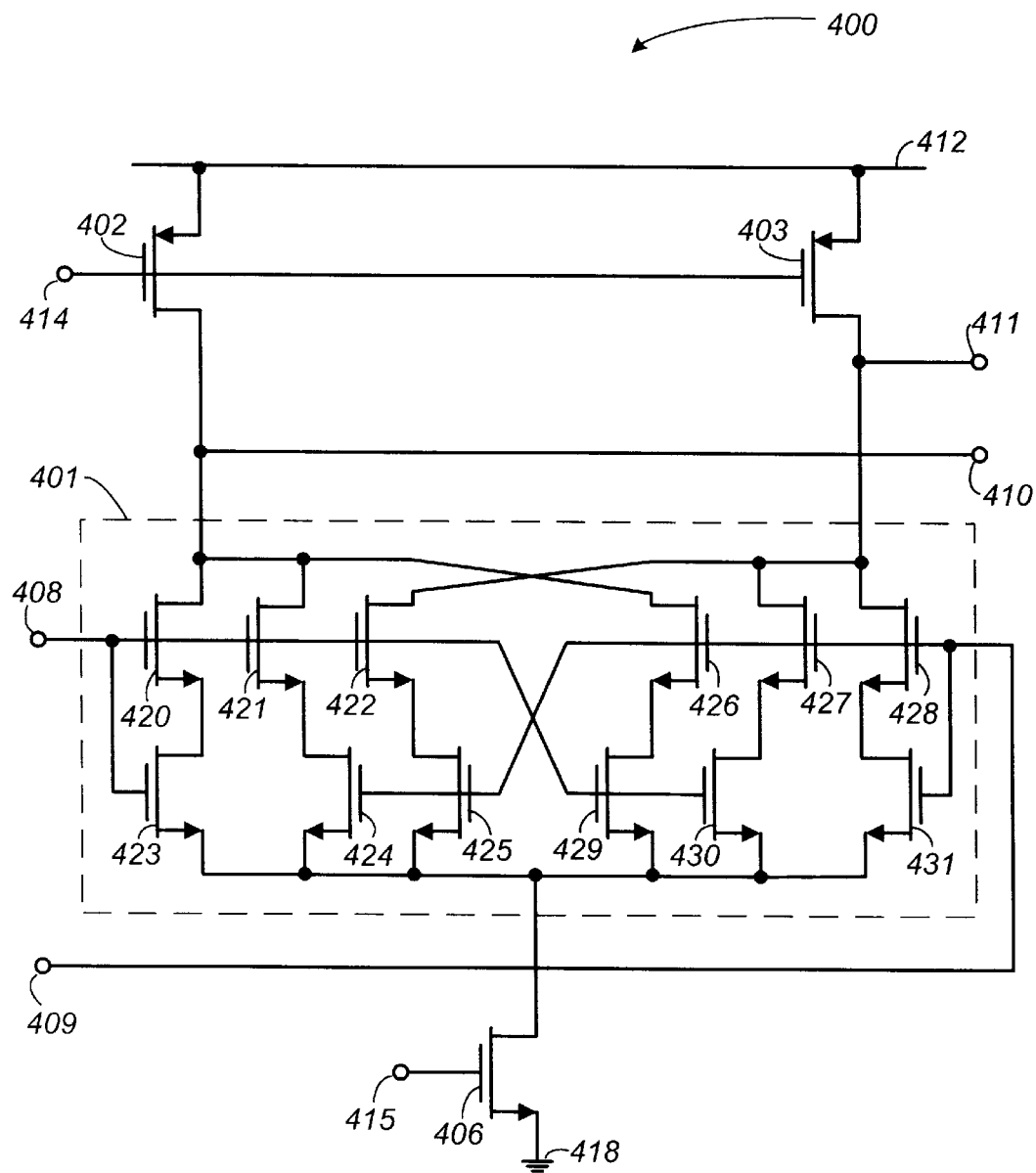
FIG. 4 shows a CMOS transconductor circuit with an input stage in accordance with another embodiment of the present invention as introduced in FIG. 2.

FIG. 4 shows a CMOS transconductor circuit 400 with an input stage 401 in accordance with another embodiment of the present invention as introduced in FIG. 2. The transconductor circuit 400 includes several of the components introduced in the transconductor circuit embodiment 200 of FIG. 2. In this regard, the transconductor circuit 400 comprises several electrically interconnected MOSFETs 402, 403, 406. The transconductor circuit 400 also comprises two voltage input terminals 408, 409 that connect to an input stage 401 as shown. As also shown in FIG. 4, the transconductor circuit 400 comprises two current output terminals 410, 411 that connect at the nodes between the drain terminal of MOSFET 402 and the input stage 401 and between the drain terminal of MOSFET 403 and the input stage 401, respectively, of the transconductor circuit 400.

The transconductor circuit 400 further comprises a voltage supply rail 412 which provides a voltage to the transconductor circuit 400 via the source terminals of MOSFETs 402, 403. Also, the transconductor circuit 400 comprises a ground 418 electrically connected to the source terminal of MOSFET 406 which may comprise, for example, a terminal connected to a common ground point in the transconductor circuit 400. Still further, the transconductor circuit 400 includes MOSFET bias inputs 414, 415 that provide a bias signal to MOSFETs 402, 403, 406 via their respective gate terminals.

Significant to the performance of the transconductor circuit 400 is the input stage 401 which allows the transconductor circuit 400 to provide increased dynamic range performance without causing the typical increase in power consumption and chip area that occurs in prior art circuits that provide similar dynamic range performance. As shown in FIG. 4, the input stage 401 comprises a plurality of electrically interconnected MOSFETs 420–431. The input stage 401 is also electrically interconnected to other elements of the transconductor circuit 400 that were described above.

The MOSFETs 420–431 are electrically interconnected in various configurations that may be described as series or pseudo-series configurations. The electrical interconnection of the MOSFETs 420, 423 is an example of a series configuration since the gate terminals of the MOSFETs 420, 423 are electrically connected and the source terminal of the MOSFET 420 is electrically connected to the drain terminal of the MOSFET 423. The electrical interconnection of the MOSFETs 421, 424 is an example of a pseudo-series configuration since the source terminal of the MOSFET 421 is electrically connected to the drain terminal of the MOSFET 424 but the gate terminals of the MOSFETs 421, 424 are not connected; it should be noted, however, that if the voltage input terminals 408, 409 were electrically connected, then the MOSFETs 421, 424 would be in a series configuration.

Several basic operating characteristics of the transconductor circuit 400 in comparison to the prior art transconductor circuit 100 (FIG. 1) are substantially the same with the important exception, however, that the dynamic range of the transconductor circuit 400 is significantly increased over the dynamic range of the prior art transconductor circuit 100. This increase in dynamic range of the transconductor circuit 400 is the result of the input stage 401 providing an increased input linear range accompanied by a relatively small decrease of the transconductance value for the transconductor circuit 400 due, in part, to an increase in the number of MOSFETs that comprise the input stage circuit 401. As discussed above with respect to Eq. 1, an increase in the product of input linear range ("$V_{in,max}$") times transconductance ("gm") directly affects the increase in the dynamic range ("DR") of a transconductor circuit.

Significantly, however, the power consumption of the transconductor circuit 400 is the same as that of the prior art transconductor circuit 100 since the total area (i.e., W/L) of the MOSFETs 420–431 of the input stage 401 is configured to be the same as the total area of the MOSFETs 104, 105 of the input stage 101 of the prior art circuit 100. Further, the output noise current and voltage headroom of the transconductor circuit 400 may be substantially the same as that of the prior art transconductor circuit 100, dependent, for example, on the production quality of the MOSFETs 420–431, such that the values of these basic operating characteristics do not differ by more than ±5%. Additionally, the input impedance, output impedance, and 3 dB bandwidth of the transconductor circuit 400 may differ negligibly from that of the prior art transconductor circuit 100 since, as described above, the total MOSFET area of the input stage 401 is the same as that of the prior art input stage 101.

Figure 5:
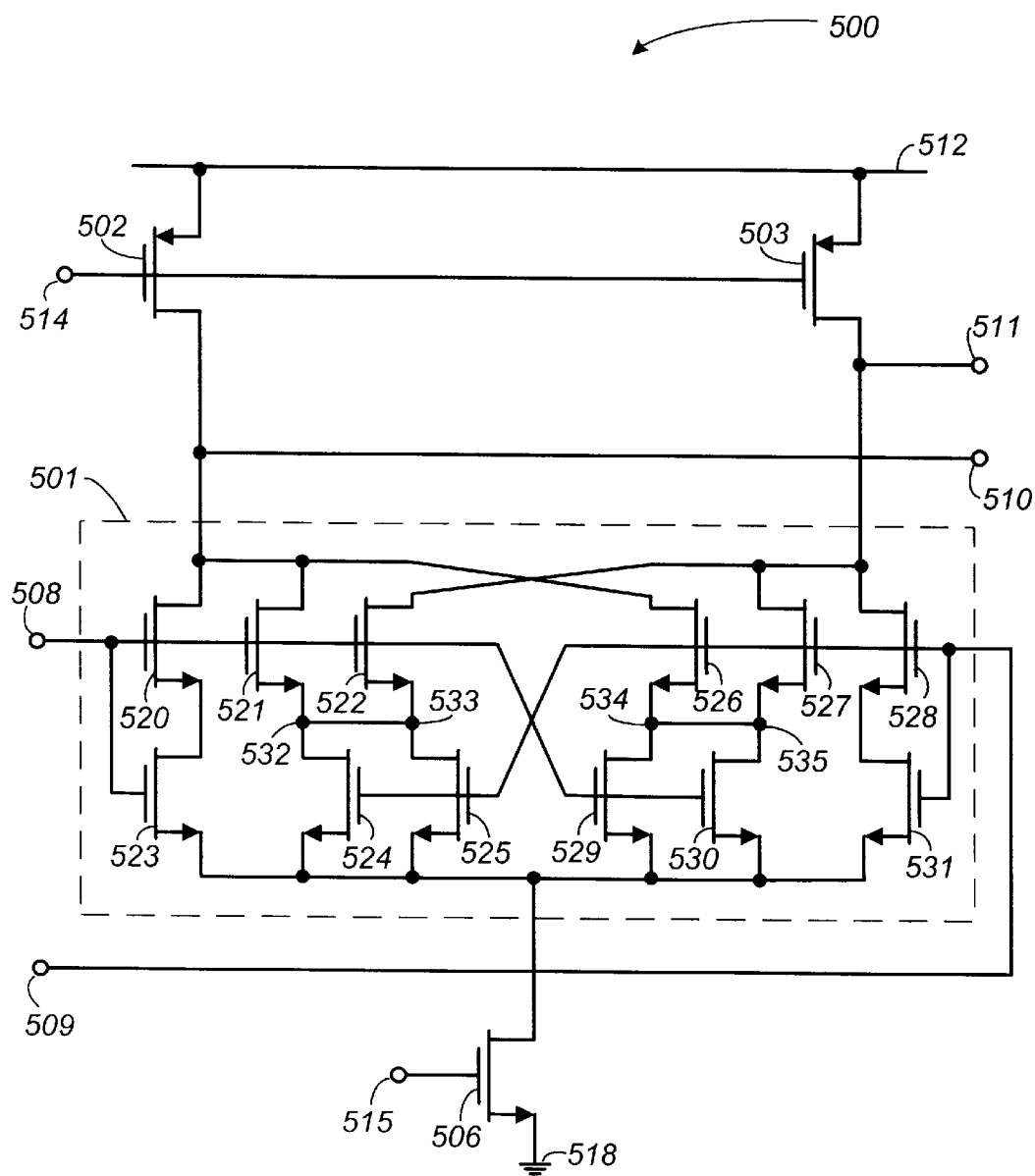
FIG. 5 shows a CMOS transconductor circuit with an input stage in accordance with another embodiment of the present invention as introduced in FIG. 2.

FIG. 5 shows a CMOS transconductor circuit 500 with an input stage 501 in accordance with another embodiment of the present invention as introduced in FIG. 2. The transconductor circuit 500 includes several of the components introduced in the transconductor circuit embodiment 200 of FIG. 2. The transconductor circuit 500 comprises several electrically interconnected MOSFETs 502, 503, 506. The transconductor circuit 500 also comprises two voltage input terminals 508, 509 that connect to an input stage 501 as shown. As also shown in FIG. 5, the transconductor circuit 500 comprises two current output terminals 510, 511 that connect at the nodes between the drain terminal of MOSFET 502 and the input stage 501 and between the drain terminal of MOSFET 503 and the input stage 501, respectively, of the transconductor circuit 500.

The transconductor circuit 500 further comprises a voltage supply rail 512 which provides a voltage to the transconductor circuit 500 via the source terminals of MOSFETs 502, 503. Also, the transconductor circuit 400 comprises a ground 518 electrically connected to the source terminal of MOSFET 506 which may comprise, for example, a terminal connected to a common ground point in the transconductor circuit 500. Still further, the transconductor circuit 500 includes MOSFET bias inputs 514, 515 that provide a bias signal to MOSFETs 502, 503, 506 via their respective gate terminals.

Significant to the performance of the transconductor circuit 500 is the input stage 501 which allows the transconductor circuit 500 to provide increased dynamic range performance without causing the typical increase in power consumption and chip area that occurs in prior art circuits that provide similar dynamic range performance. As shown in FIG. 5, the input stage 501 comprises a plurality of electrically interconnected MOSFETs 520–531. The input stage 501 is also electrically interconnected to other elements of the transconductor circuit 500 described above.

The MOSFETs 520–531 are electrically interconnected in various configurations that may be described as parallel, series, or pseudo-series configurations. The electrical interconnection of the MOSFETs 524, 525 is an example of a parallel configuration since the drain terminals, gate terminals, and source terminals respectively of the MOSFETs 524, 525 are electrically connected. The electrical interconnection of the MOSFETs 520, 523 is an example of a series configuration since the gate terminals of the MOSFETs 520, 523 are electrically connected and the source terminal of the MOSFET 520 is electrically connected to the drain terminal of the MOSFET 523. Finally, the electrical interconnection of the MOSFETs 521, 524 is an example of a pseudo-series configuration since the source terminal of the MOSFET 521 is electrically connected to the drain terminal of the MOSFET 524 but the gate terminals of the MOSFETs 521, 524 are not connected; it should be noted, however, that if the voltage input terminals 508, 509 were electrically connected, then the of the MOSFETs 521, 524 would be in a series configuration.

It is additionally noted that the there are several equipotential (i.e., operating at the same voltage) nodes within the input stage 501 of the transconductor circuit 500. In this embodiment of the transconductor circuit 500, node 532 and node 533 are electrically connected, and similarly, node 534 and node 535 are also electrically connected.

Several basic operating characteristics of the transconductor circuit 500 in comparison to the prior art transconductor circuit 100 (FIG. 1) are substantially the same with the important exception, however, that the dynamic range of the transconductor circuit 500 is significantly increased over the dynamic range of the prior art transconductor circuit 100. This increase in dynamic range of the transconductor circuit 500 is the result of the input stage 501 providing an increased input linear range accompanied by a relatively small decrease of the transconductance value for the transconductor circuit 500 due, in part, to an increase in the number of MOSFETs that comprise the input stage circuit 501. Recalling the above discussion with respect to Eq. 1, an increase in the product of the input linear range ("$V_{in,max}$") times the transconductance value ("gm") directly influences an increase in the dynamic range ("DR") of a transconductor circuit.

Significantly, however, the power consumption of the transconductor circuit 500 is the same as that of the prior art transconductor circuit 100 since the total area (i.e., W/L) of the MOSFETs 520–531 of the input stage 501 is configured to be the same as the total area of the MOSFETs 104, 105 of the input stage 101 of the prior art circuit 100. Further, the output noise current and voltage headroom of the transconductor circuit 500 may be substantially the same as that of the prior art transconductor circuit 100, dependent, for example, on the production quality of the MOSFETs 520–531, such that the values of these basic operating characteristics do not differ by more than ±5%. Additionally, the input impedance, output impedance, and 3 dB bandwidth of the transconductor circuit 500 may differ negligibly from that of the prior art transconductor circuit 100 since, as described above, the total MOSFET area of the input stage 501 is the same as that of the prior art input stage 101.

The transconductor circuits 300, 400, 500 described above are examples of several embodiments in accordance with the present invention. In this regard, several points should be understood. First, it should be understood that although n-channel and p-channel MOSFETs are depicted in certain circuit positions in the above described embodiments, these MOSFETs may be complementarily interchanged, as will be apparent to one skilled in the art. Further, other types of transistors may be employed in place of MOSFETs in some embodiments, as will be apparent to one skilled in the art. Second, it should be understood that although the input stages 201, 301, 401, and 501 shown in FIGS. 2, 3, 4, and 5 respectively are presented within a particular transconductor circuit framework, the input stages 201, 301, 401, 501 may be employed within other circuits and still remain within the scope of the present invention, as will be apparent to one skilled in the art. Finally, it should be understood that many other embodiments within the scope of the present invention exist, as will be apparent to one skilled in the art, and in this regard, attention is now focused on FIG. 6.

Figure 6:
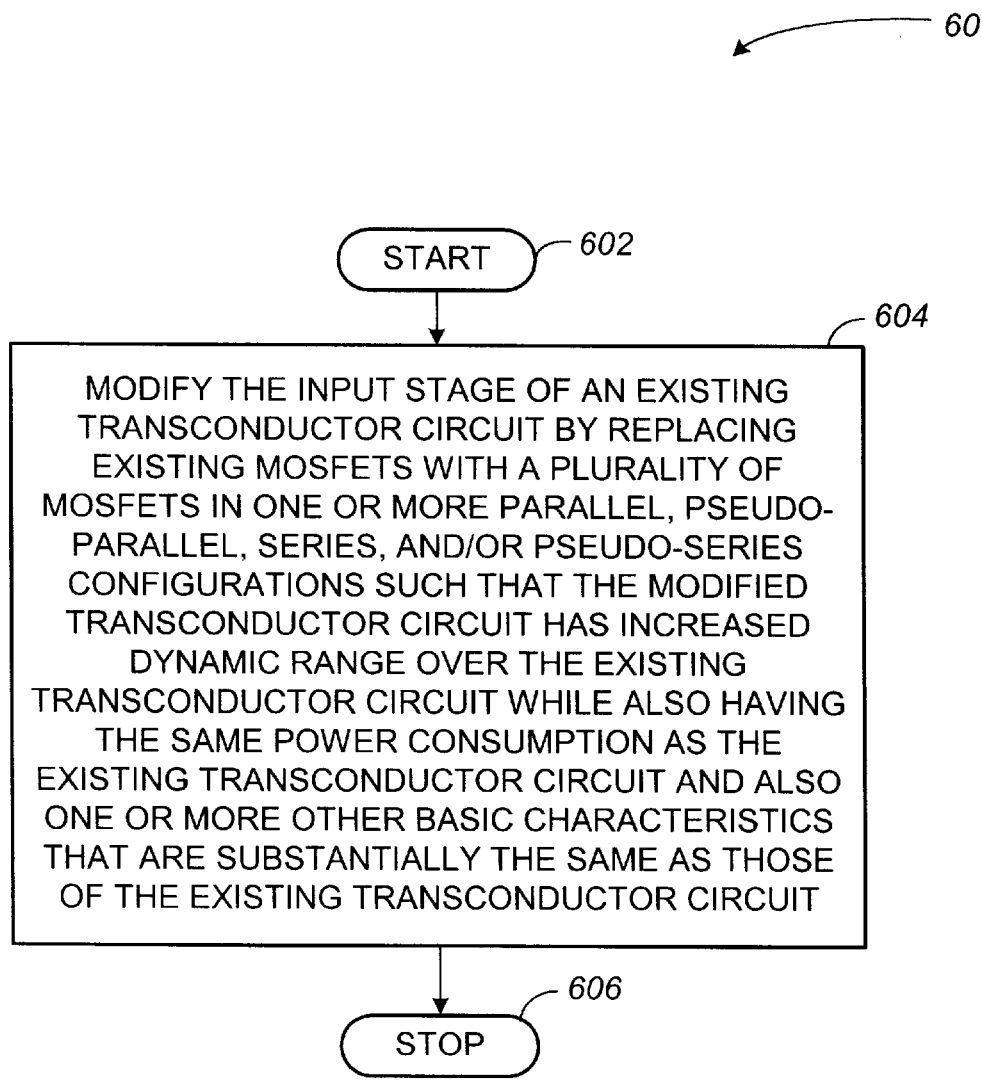
FIG. 6 shows a flowchart diagram of a method, in accordance with another embodiment of the present invention, for providing a CMOS transconductor circuit that has increased dynamic range over the prior art transconductor circuit of FIG. 1 while also having one or more other basic operating characteristics that are substantially the same as those of the prior art transconductor circuit of FIG. 1.

FIG. 6 shows a flowchart diagram of a method 600 for providing a CMOS transconductor circuit that has increased dynamic range over the prior art transconductor circuit 100 of FIG. 1 while also having one or more other basic operating characteristics that are substantially the same as those of the prior art transconductor circuit 100. Specifically, a CMOS transconductor circuit provided by the method 600 will have an increased dynamic range over the prior art transconductor circuit 100 which may be due to, for example, an increased product value of the input linear range ("$V_{in,max}$") times the transconductance value ("gm") in comparison to the prior art transconductor circuit 100. Further, a transconductor circuit provided by the method 600 will have the same power consumption as the prior art transconductor circuit 100 and this may be a result of, for example, the provided transconductor circuit being configured to have the same total MOSFET area (W/L) as that of the input stage 101 of the prior art transconductor circuit 100. A transconductor provided by the method 600 may also have an output noise current and voltage headroom that are substantially the same as those of the prior art transconductor circuit 100 such that the values of these basic operating characteristics do not differ by more than ±5%. Finally, the transconductor circuit provided by the method 600 may have input impedance, output impedance, and 3 dB bandwidth characteristics that differ negligibly from those of the prior art transconductor circuit 100.

The method 600 begins with the start step 602. From the start step 602, the method proceeds to step 604 in which the input stage of the prior art CMOS transconductor circuit 100 of FIG. 1 is modified. Specifically, the input stage 101 of the transconductor circuit 100 is modified such that the existing MOSFETs 104, 105 that make up the input stage 101 are replaced with a plurality of MOSFETs arranged in one or more parallel configurations, pseudo-parallel configurations, series configurations, and/or pseudo-series configurations such as, for example, the MOSFET configurations described with respect to the transconductor circuits 300, 400, 500 of FIGS. 3, 4, and 5 respectively.

The modifications of step 604 are made with respect to several criteria. One, the dynamic range of the modified circuit should be increased over that of the prior art transconductor circuit 100. Two, the power consumption of the replacement input stage should be the same as that of the original input stage 101 of the prior art circuit 100. This second criteria may be facilitated, for example, by making the total area of the MOSFETs used to replace the existing MOSFETs 104, 105 of the input stage 101 the same as the total area of the existing MOSFETs 104, 105.

In addition to the foregoing criteria, the modifications of step 604 may also be made with the criteria that the output noise current and voltage headroom of the modified circuit are substantially the same as that of the prior art transconductor circuit 100 such that the values of these basic operating characteristics do not differ by more than ±5%. Also additionally, the modifications of step 604 may be made with the criteria that the input impedance, output impedance, and 3 dB bandwidth characteristics of the modified circuit differ negligibly from those of the prior art transconductor circuit 100.

Following step 604 of the method 600, the stop step 606 is reached. At this step 606, the method 600 is complete.

Figure 7:
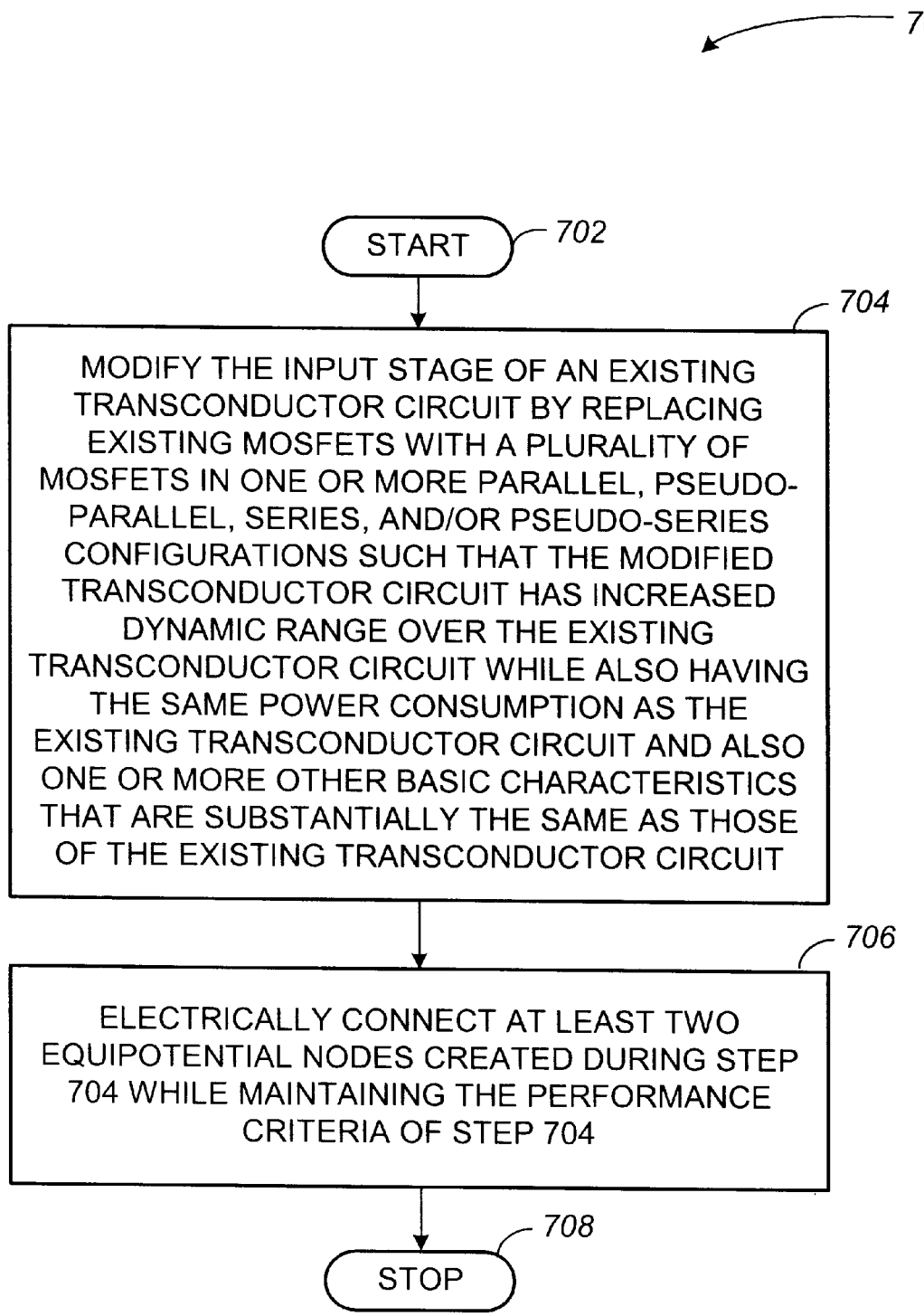
FIG. 7 shows a flowchart diagram of a method, in accordance with another embodiment of the present invention, for providing a CMOS transconductor circuit that has increased dynamic range over the prior art transconductor circuit of FIG. 1 while also having one or more other basic operating characteristics that are substantially the same as those of the prior art transconductor circuit of FIG. 1.

Turning now to FIG. 7, a flowchart diagram is shown of a method 700, in accordance with another embodiment of the present invention, for providing a CMOS transconductor circuit that has increased dynamic range over the prior art transconductor circuit 100 of FIG. 1 while also having one or more other basic operating characteristics that are substantially the same as those of the prior art transconductor circuit 100. Specifically, a CMOS transconductor circuit provided by the method 700 will have an increased dynamic range over the prior art transconductor circuit 100 which may be due to, for example, an increased product value of the input linear range ("$V_{in,max}$") times the transconductance value ("gm") in comparison to the prior art transconductor circuit 100. Further, a transconductor circuit provided by the method 700 will have the same power consumption as the prior art transconductor circuit 100 and this may be a result of, for example, the input stage of the provided transconductor circuit being configured to have the same total MOSFET area (W/L) as that of the input stage 101 of the prior art transconductor circuit 100. A transconductor provided by the method 700 may also have an output noise current and voltage headroom that are substantially the same as those of the prior art transconductor circuit 100 such that the values of these characteristics do not differ by more than ±5%. Finally, the transconductor circuit provided by the method 700 may have input impedance, output impedance, and 3 dB bandwidth characteristics that differ negligibly from those of the prior art transconductor circuit 100.

The method 700 begins with the start step 702. From the start step 702, the method proceeds to step 704 in which the input stage of the prior art CMOS transconductor circuit 100 of FIG. 1 is modified. Specifically, the input stage 101 of the transconductor circuit 100 is modified such that the existing MOSFETs 104, 105 that make up the input stage 101 are replaced with a plurality of MOSFETs arranged in one or more parallel configurations, pseudo-parallel configurations, series configurations, and/or pseudo-series configurations such as, for example, the MOSFET configurations described with respect to the transconductor circuits 300, 400, 500 of FIGS. 3, 4, and 5 respectively.

The modifications of step 704 are made with respect to several criteria. One, the dynamic range of the modified circuit should be increased over that of the prior art transconductor circuit 100. Two, the power consumption of the replacement input stage should be the same as that of the original input stage 101 of the prior art circuit 100. This second criteria may be facilitated, for example, by making the total area of the MOSFETs used to replace the existing MOSFETs 104, 105 of the input stage 101 the same as the total area of the existing MOSFETs 104, 105.

In addition to the foregoing criteria, the modifications of step 704 may also be made with the criteria that the output noise current and voltage headroom of the modified circuit are substantially the same as that of the prior art transconductor circuit 100 such that the values of these characteristics do not differ by more than ±5%. Also additionally, the modifications of step 704 may be made with the criteria that the input impedance, output impedance, and 3 dB bandwidth characteristics of the modified circuit differ negligibly from those of the prior art transconductor circuit 100.

Following step 704 of the method 700 is step 706 in which at least two of any of the equipotential nodes (i.e., nodes that operate at the same voltage) created during the modification step 704 are electrically connected together such that the criteria maintained in step 704 are still met. Following step 706 of the method 700 is the stop step 706 at which point the method 700 is complete.

It is noted that the foregoing flowchart diagrams of the methods 600, 700 described above and shown in FIGS. 6 and 7 respectively show the architecture, functionality, and operation of possible implementations of embodiments of the present invention. It is further noted that in some alternative implementations of the methods 600, 700, the functions noted in the blocks of the respective flowchart diagrams may occur in an order different from that shown in the figures. Additionally, although the foregoing methods 600, 700 are described with respect to the transconductor circuit 100 of FIG. 1, the application of these methods 600, 700 may not be limited to this circuit 100, as will be apparent to one skilled in the art.

It is emphasized that the above-described embodiments of the present invention are merely possible examples of the implementations that are merely set forth for a clear understanding of the principles of the invention. It will be apparent to those skilled in the art that many modifications and variations may be made to the above-disclosed embodiments of the present invention without departing substantially from the spirit and principles of the invention. All such modifications and variations are intended to be included herein within the scope of the disclosure and present invention and protected by the following claims.

Therefore, having thus described the invention, at least the following is claimed:

1. A transconductor circuit that includes an input stage, the input stage comprising:

a first transistor connected to a second transistor in series in a first circuit configuration, wherein an input terminal of the first transistor that is directly connected to a corresponding input terminal of the second transistor is further directly connected to a first voltage input terminal of the transconductor circuit;

a third transistor connected to a fourth transistor in a second circuit configuration, wherein an input terminal of the third transistor is directly connected to the first voltage input terminal of the transconductor circuit and a corresponding input terminal of the fourth transistor is directly connected to a second voltage input terminal of the transconductor circuit;

a fifth transistor connected to a sixth transistor in series in the first circuit configurations, wherein an input terminal of the fifth transistor that is directly connected to a corresponding input terminal of the sixth transistor is further directly connected to the second voltage input terminal of the transconductor circuit; and a seventh transistor connected to a eighth transistor in the second circuit configuration, wherein an input terminal of the seventh transistor is directly connected to the second voltage input terminal of the transconductor circuit and a corresponding input terminal of the eighth transistor is directly connected to the first voltage input terminal of the transconductor circuit.

2. The transconductor circuit of claim 1, wherein the input stage further comprises:

the first transistor connected to the third transistor in a third circuit configuration; and the fifth transistor connected to the seventh transistor in the third circuit configuration.

3. The transconductor circuit of claim 2, wherein the first circuit configuration is a series circuit configuration, the second circuit configuration is a pseudo-series circuit configuration, and the third circuit configuration is a parallel circuit configuration.

4. The transconductor circuit of claim 3, wherein the first, second, third, fourth, fifth, sixth, seventh, and eighth transistors are MOSFETs, and the input terminals of the first, second, third, fourth, fifth, sixth, seventh, and eighth transistors are the gate terminals of MOSFETs.

5. The transconductor circuit of claim 1, wherein the input stage further comprises:

a ninth transistor connected to a tenth transistor in the second circuit configuration, wherein an input terminal of the ninth transistor is directly connected to the first voltage input terminal of the transconductor circuit and a corresponding input terminal of the tenth transistor is directly connected to the second voltage input terminal of the transconductor circuit; and a eleventh transistor connected to a twelfth transistor in the second circuit configuration, wherein an input terminal of the eleventh transistor is directly connected to the second voltage input terminal of the transconductor circuit and a corresponding input terminal of the twelfth transistor is directly connected to the first voltage input terminal of the transconductor circuit.

6. The transconductor circuit of claim 5, wherein the first circuit configuration is a series circuit configuration and the second circuit configuration is a pseudo-series circuit configuration.

7. The transconductor circuit of claim 6, wherein the first, second, third, fourth, fifth, sixth, seventh, eighth, ninth, tenth, eleventh, and twelfth transistors are MOSFETs, and the input terminals of the first, second, third, fourth, fifth, sixth, seventh, eighth, ninth, tenth, eleventh, and twelfth transistors are the gate terminals of MOSFETs.

8. The transconductor circuit of claim 5, wherein the input stage further comprises:

the third transistor connected to the ninth transistor in a third circuit configuration; and the seventh transistor connected to the eleventh transistor in the third circuit configuration.

9. The transconductor circuit of claim 8, wherein the first circuit configuration is a series circuit configuration, the second circuit configuration is a pseudo-series circuit configuration, and the third circuit configuration is a pseudo-parallel circuit configuration.

10. The transconductor circuit of claim 9, wherein the first, second, third, fourth, fifth, sixth, seventh, eighth, ninth, tenth, eleventh, and twelfth transistors are MOSFETs, and the input terminals of the first, second, third, fourth, fifth, sixth, seventh, eighth, ninth, tenth, eleventh, and twelfth transistors are the gate terminals of MOSFETs.

* * * * *